United States Patent
Liu

(10) Patent No.: US 12,179,229 B2
(45) Date of Patent: Dec. 31, 2024

(54) NOZZLE

(71) Applicant: Illinois Tool Works Inc., Glenview, IL (US)

(72) Inventor: Guohua Liu, Suzhou New District (CN)

(73) Assignee: Illinois Tool Works Inc., Glenview, IL (US)

(*) Notice: Subject to any disclaimer, the term of this patent is extended or adjusted under 35 U.S.C. 154(b) by 420 days.

(21) Appl. No.: 17/295,746

(22) PCT Filed: Nov. 4, 2019

(86) PCT No.: PCT/US2019/059665
§ 371 (c)(1),
(2) Date: May 20, 2021

(87) PCT Pub. No.: WO2020/106441
PCT Pub. Date: May 28, 2020

(65) Prior Publication Data
US 2022/0016663 A1 Jan. 20, 2022

(30) Foreign Application Priority Data
Nov. 22, 2018 (CN) .......................... 201811397781.7

(51) Int. Cl.
*B05C 5/02* (2006.01)
*B05B 7/08* (2006.01)
(Continued)

(52) U.S. Cl.
CPC .......... *B05C 5/0225* (2013.01); *B05B 7/0815* (2013.01); *B05C 5/0212* (2013.01);
(Continued)

(58) Field of Classification Search
CPC . B05C 5/0225; B05C 5/0212; B05C 11/1034; B05B 7/0815; B05B 1/083;
(Continued)

(56) References Cited

U.S. PATENT DOCUMENTS 4,629,478 A * 12/1986 Browner ............... H01J 49/045
  261/78.2
4,819,831 A * 4/1989 Green .................... B01J 35/51
  261/76
(Continued)

FOREIGN PATENT DOCUMENTS

DE 19854634 2/2000
DE 19854634 C1 2/2000
(Continued)

OTHER PUBLICATIONS

Search Report for Taiwan Invention Patent Application No. 108137399 dated Feb. 16, 2023.
(Continued)

*Primary Examiner* — Frederick C Nicolas
(74) *Attorney, Agent, or Firm* — Lando & Anastasi, LLP

(57) ABSTRACT

A nozzle includes a nozzle passage and a fluid passage. The nozzle passage has an airflow inlet and an airflow outlet. The fluid passage has a fluid passage inlet and a fluid passage outlet. The fluid passage inlet communicates with a fluid source so that a fluid can enter the fluid passage, and the fluid passage outlet communicates with the nozzle passage so that the fluid can enter the nozzle passage, and the airflow exerted from the airflow inlet can press the fluid in the nozzle passage out of the airflow outlet. The nozzle provided by the present application can distribute a small volume of a viscous fluid and is not apt to get blocked.

13 Claims, 8 Drawing Sheets

(51) Int. Cl.
- *B05C 11/10* (2006.01)
- *B23K 3/06* (2006.01)
- *G01F 11/02* (2006.01)
- *G01F 11/28* (2006.01)
- *B05B 1/08* (2006.01)
- *H05K 3/12* (2006.01)

(52) U.S. Cl.
CPC ........ *B05C 11/1034* (2013.01); *B23K 3/0638* (2013.01); *G01F 11/021* (2013.01); *G01F 11/28* (2013.01); *B05B 1/083* (2013.01); *H05K 3/1241* (2013.01)

(58) Field of Classification Search
CPC ..... B23K 3/0638; H05K 3/1241; G01F 11/28; G01F 11/021
See application file for complete search history.

(56) References Cited

U.S. PATENT DOCUMENTS

| | | | | |
|---|---|---|---|---|
| 4,941,428 A * | 7/1990 | Engel | .................... | H05K 3/0091 |
| | | | | 118/680 |
| 5,360,516 A | 11/1994 | Cutright | | |
| 6,253,957 B1 * | 7/2001 | Messerly | .............. | B05C 5/0225 |
| | | | | 222/61 |
| 6,270,019 B1 * | 8/2001 | Reighard | ................ | B05B 7/066 |
| | | | | 239/290 |
| 7,621,465 B2 * | 11/2009 | Riney | ................... | B05B 7/0807 |
| | | | | 118/325 |
| 9,095,872 B2 * | 8/2015 | Topf | .................... | B05C 11/1013 |
| 9,156,054 B2 * | 10/2015 | Ikushima | .............. | B41J 2/04556 |
| 9,168,554 B2 * | 10/2015 | Saine | .................... | D06B 3/045 |
| 9,393,586 B2 * | 7/2016 | Donner | ................ | B05C 5/0283 |
| 9,797,035 B2 * | 10/2017 | Pahl | ........................ | B05B 12/20 |
| 2006/0027683 A1 | 2/2006 | Puffe | | |
| 2007/0102539 A1 * | 5/2007 | Riney | ................... | B05B 7/0807 |
| | | | | 239/296 |
| 2011/0172703 A1 | 7/2011 | Redl | | |
| 2012/0258246 A1 * | 10/2012 | Saine | ..................... | B05C 11/06 |
| | | | | 118/63 |
| 2013/0052359 A1 * | 2/2013 | Ahmadi | ................ | B05C 5/0225 |
| | | | | 137/624.13 |
| 2015/0337426 A1 | 11/2015 | Pahl | | |
| 2019/0168251 A1 * | 6/2019 | Brevemark | ......... | B05C 11/1034 |

FOREIGN PATENT DOCUMENTS

| | | |
|---|---|---|
| EP | 0609075 A1 | 8/1994 |
| JP | 1994210221 | 8/1994 |
| JP | 2004237150 A | 8/2004 |
| JP | 2013094758 A | 5/2013 |
| TW | M296741 U | 9/2006 |

OTHER PUBLICATIONS

International Search Report and Written Opinion from International Application No. PCT/US2019/059665 dated Apr. 15, 2020.
Int'l Search Report and Written Opinion Appln No. PCT/US2019/05966 dated Apr. 28, 2020.

* cited by examiner

NOZZLE

RELATED APPLICATIONS

This international application claims priority to Chinese Patent Application Serial No. 201811397781.7, filed Nov. 22, 2018, entitled "A NOZZLE." The entirety of Chinese Patent Application Serial No. 201811397781.7 is incorporated herein by reference.

TECHNICAL FIELD

The present application relates to a nozzle, and in particular relates to a nozzle used in the field of electronic processing.

BACKGROUND ART

With the continuous miniaturization of electronic products, higher requirements are put forward for the printing process of printed circuit boards. Therefore, a device which can more precisely distribute processing materials is required to distribute a very small volume of processing materials of printed circuit boards. Some processing materials are viscous fluids, for example, solder paste and resin. A solution for distributing such a viscous fluid is as follows: A chamber is provided, the chamber communicates with a nozzle, the chamber contains a fluid, and the fluid in the chamber is extruded through reciprocating movements of a piston so that the fluid is extruded out of the nozzle. Since the flowability of viscous fluids is low, such a fluid distribution solution has certain defects, for example, a low distribution efficiency, a low controllability and a blockage tendency.

SUMMARY OF THE INVENTION

To overcome the problems above, the present application provide a nozzle and a nozzle assembly.

According to the first aspect of the present application, a nozzle is provided and the nozzle comprises:
 a nozzle passage, the nozzle passage having an airflow inlet and an airflow outlet,
 a fluid passage, the fluid passage having a fluid passage inlet and a fluid passage outlet, wherein the fluid passage inlet communicates with a fluid source so that a fluid can enter the fluid passage, and the fluid passage outlet communicates with the nozzle passage so that the fluid can enter the nozzle passage,
 wherein the airflow exerted from the airflow inlet can press the fluid in the nozzle passage out of the airflow outlet.

According to the above-mentioned nozzle, the nozzle passage further has a fluid inlet, and
 the fluid passage outlet communicates with the fluid inlet of the nozzle passage so that a fluid can enter the nozzle passage.

According to the above-mentioned nozzle, the fluid is a viscous fluid and the viscosity of the fluid ranges from 1000 cps to 150,000 cps.

The above-mentioned nozzle further comprises a piston chamber, the piston chamber being used to accommodate a piston and the piston chamber communicating with the airflow inlet of the nozzle passage.

According to the above-mentioned nozzle, the piston chamber and the fluid passage are separately arranged.

According to the above-mentioned nozzle, the bottom of the piston chamber is in the shape of a smoothly-transitioned curved surface.

According to the above-mentioned nozzle, the airflow inlet is located below the piston chamber.

According to the above-mentioned nozzle, the fluid passage inlet is arranged on the side wall of the nozzle.

According to the above-mentioned nozzle, the fluid passage extends aslant downward from the fluid passage inlet to the fluid passage outlet.

According to the above-mentioned nozzle, the nozzle passage has an upper nozzle passage section and a lower nozzle passage section, and the lower nozzle passage section is thinner than the upper nozzle passage section, wherein the upper nozzle passage section communicates with the airflow inlet.

According to the second aspect of the present application, a nozzle assembly is provided and the nozzle assembly comprises:
 a casing, a chamber being arranged in the casing,
 a sleeve, the sleeve being arranged in the chamber of the casing, the inner wall of the sleeve defining a piston passage, and a fluid chamber being arranged between the outer wall of the sleeve and the inner wall of the casing,
 a nozzle, the nozzle being arranged in the chamber of the casing and being arranged below the sleeve, the nozzle comprising:
 a nozzle passage, the nozzle passage having an airflow inlet and an airflow outlet,
 a fluid passage, the fluid passage having a fluid passage inlet and a fluid passage outlet, wherein the fluid passage inlet communicates with the fluid chamber so that a fluid can enter the fluid passage, and the fluid passage outlet communicates with the nozzle passage so that the fluid can enter the nozzle passage,
 a piston chamber, the piston chamber communicating with the airflow inlet of the nozzle passage and communicating with the piston passage, and
 a piston, the piston being able to move up and down in the piston passage and the piston chamber and being able to draw in and discharge air through the nozzle passage to press the fluid in the nozzle passage out of the airflow outlet of the nozzle passage.

According to the above-mentioned nozzle assembly, the piston has a head portion, the shape of the head portion is configured to match the shape of the piston chamber of the nozzle so that the piston can draw in and discharge air through the nozzle passage when reciprocating relative to the nozzle.

According to the above-mentioned nozzle assembly, the casing has an inlet and the inlet communicates with the fluid chamber.

According to the above-mentioned nozzle assembly, the sleeve is seal-connected to the nozzle and the sleeve is seal-connected to the casing.

According to the above-mentioned nozzle assembly, the nozzle assembly is seal-connected to the casing.

The nozzle provided by the present application can distribute a small volume of a viscous fluid and is not apt to get blocked.

DETAILED DESCRIPTION OF THE INVENTION

Figure 1:
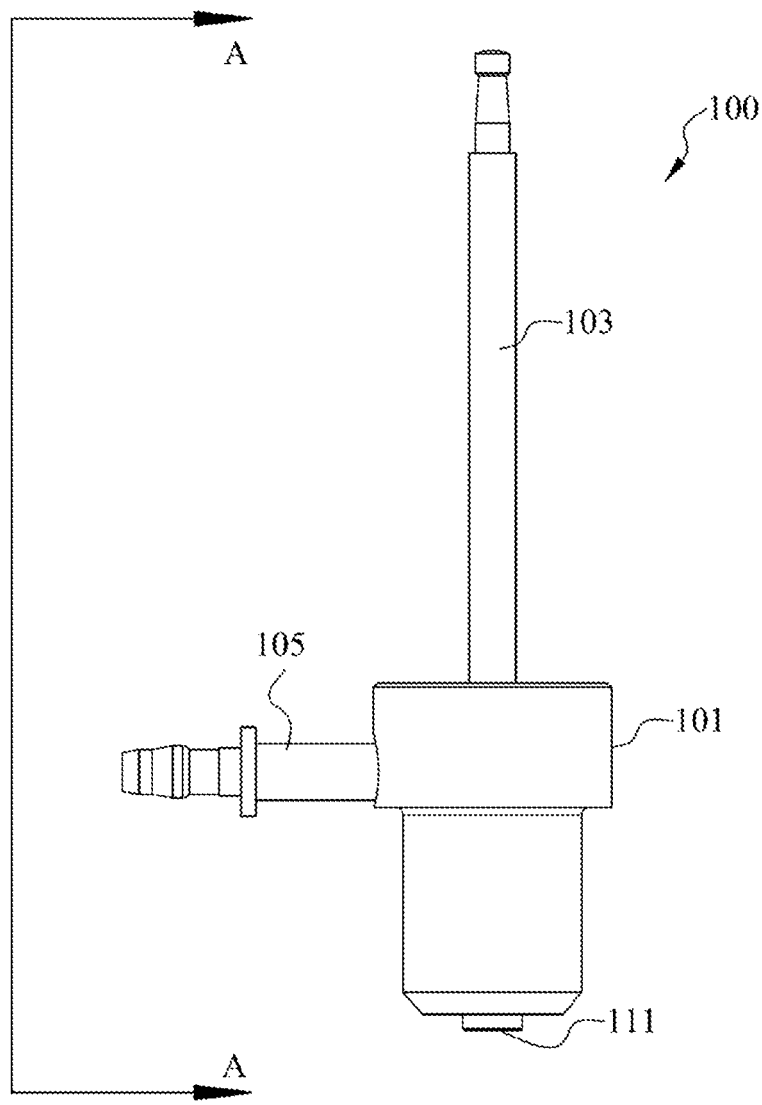
FIG. 1 is a side view of one embodiment of the nozzle assembly of the present application.

Various specific implementation modes of the present invention will be described by reference to the drawings which constitute a part of the present description. It should be understood that although the terms indicating directions, such as "before", "behind", "on", "below", "left", "right", "top" and "bottom" are used to describe various exemplified structural parts and components in the present application, these terms are used solely for the convenience of illustrations and are determined based on the exemplified directions in the drawings. Since the embodiments disclosed in the present application can be set in different directions, these terms indicating directions are only used as illustrations, instead of restrictions.

FIG. 1 is a side view of one embodiment of the nozzle assembly of the present application. As shown in FIG. 1, the nozzle assembly 100 comprises a body 101, a piston 103 and a fluid transport pipe 105, and a body fluid outlet 111 is arranged at the bottom of the body 101. A fluid enters the body 101 from the fluid transport pipe 105 and the fluid in the body 101 can be pressed out of the body fluid outlet 111 through up-and-down movements of the piston relative to the body 101. The nozzle assembly (100) of the present application is applicable to the distribution of a viscous fluid, with a viscosity of 1000 cps to 150,000 cps, for example. The viscous fluid may be a solder paste or conductive material in the field of electronic processing.

Figure 2:
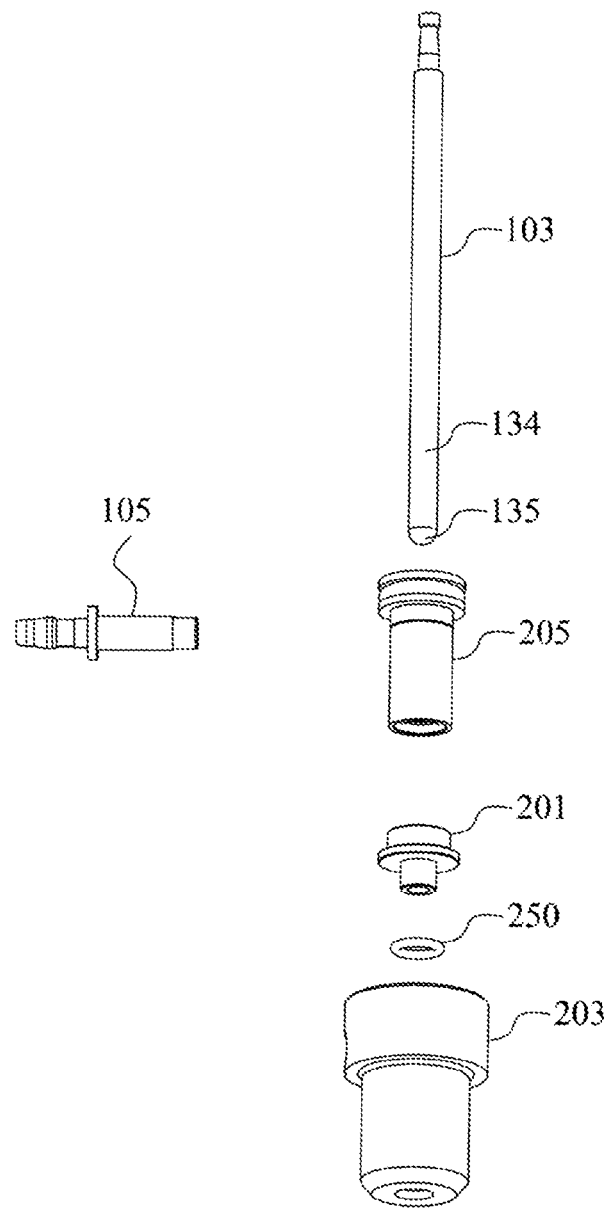
FIG. 2 is an exploded view of the nozzle assembly shown in FIG. 1.

FIG. 2 is an exploded view of the nozzle assembly 100 shown in FIG. 1. As shown in FIG. 2, the body 101 comprises a casing 203, a sleeve assembly 205 and a nozzle 201. The sleeve assembly 205 and the nozzle 201 are located in the casing 203, and the piston 103 can be inserted into the sleeve assembly 205 and the nozzle 201. One end of the fluid transport pipe 105 can be inserted into the casing 203. The piston 103 has a cylindrical rod portion 134 and a round head portion 135, and the head portion 135 can be inserted into the nozzle 201. A nozzle seal 250 is further arranged between the nozzle 201 and the casing 203.

Figure 3A:
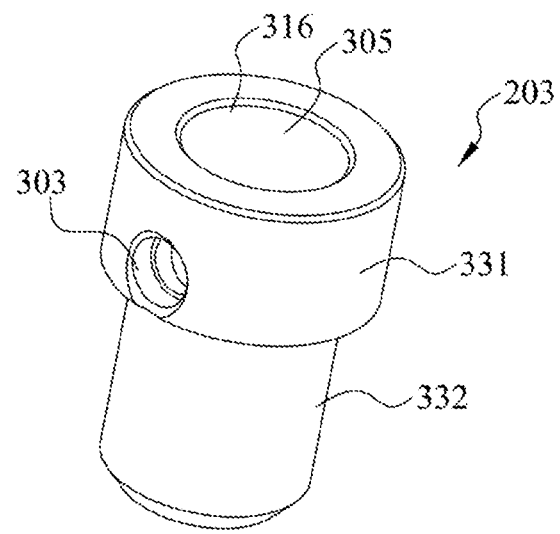
FIG. 3A is a 3-D view of the casing of the nozzle assembly shown in FIG. 1.
Figure 3B:
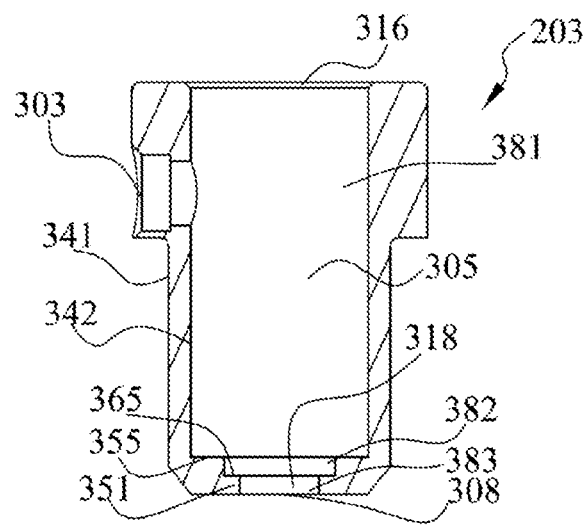
FIG. 3B is an axial cutaway view of the casing of the nozzle assembly shown in FIG. 3A.

FIG. 3A is a 3-D view of the casing 203 of the nozzle assembly 100 shown in FIG. 1 in one direction, and FIG. 3B is an axial cutaway view of the casing 203 shown in FIG. 3A in a direction passing through the inlet 303 in FIG. 3A and is used to show the structure of the casing. As shown in FIGS. 3A and 3B, the casing 203 is roughly in the shape of a cylinder. The casing 203 has an outer wall 341 and an inner wall 342, and the inner wall 342 defines the chamber 305 of the casing 203. The chamber 305 has an upper opening 316 and a lower opening 318. The chamber 305 is roughly in the shape of a cylinder.

The casing 203 comprises a lower casing portion 331 and an upper casing portion 332, and an inlet 303 communicating with the chamber 305 is arranged on the side wall of the upper casing portion 331. One end of the fluid transport pipe 105 is inserted into the inlet 303 so that the fluid transport pipe 105 can communicate with the chamber 305. The thickness of the side wall of the upper casing portion 331 is larger so that the fluid transport pipe 105 can be installed. In one embodiment of the present application, the outside diameter of the upper casing portion 331 is larger than the outside diameter of the lower casing portion 332 to form the thicker side wall of the upper casing portion 331.

The chamber 305 comprises an upper section 381, a middle section 382 and a lower section 383. The upper section 381 communicates with the upper opening 316, and the lower section 383 communicates with the lower opening 318. The diameter of the middle section 382 is less than the diameter of the upper section 381, and thus a nozzle-limiting step 355 is formed between the middle section 382 and the upper section 381. The diameter of the lower section 383 is less than the diameter of the middle section 382, and thus a seal-limiting step 365 is formed between the lower section 383 and the middle section 382. The nozzle-limiting step 355 is used to prevent the nozzle 201 mounted in the chamber 305 of the casing 203 from falling off the lower opening 318 of the casing 203. The seal-limiting step 365 is used to prevent the nozzle seal 250 between the nozzle 201 and the casing 203 from falling off the lower opening 318 of the casing 203.

Figure 4A:
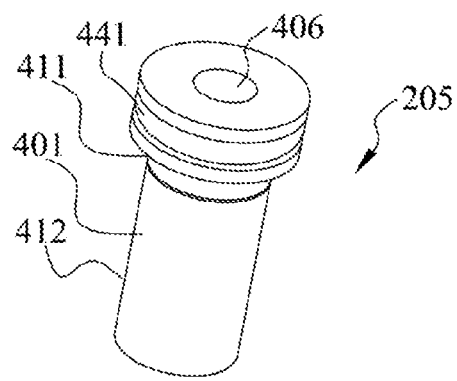
FIG. 4A is a 3-D view of the sleeve assembly of the nozzle assembly shown in FIG. 1.
Figure 4B:
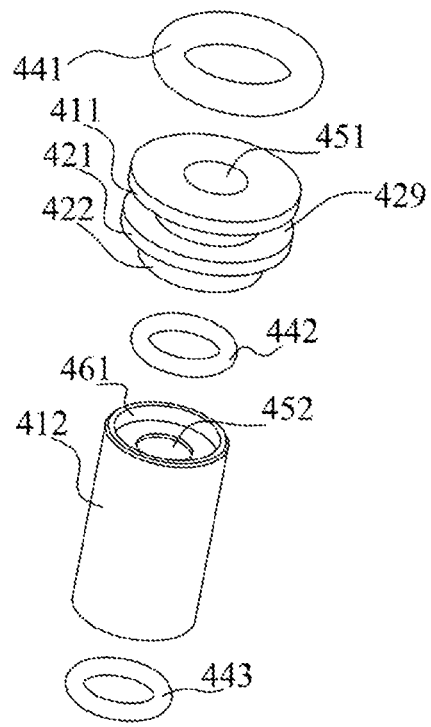
FIG. 4B is an exploded view of the sleeve assembly shown in FIG. 4A.
Figure 4C:
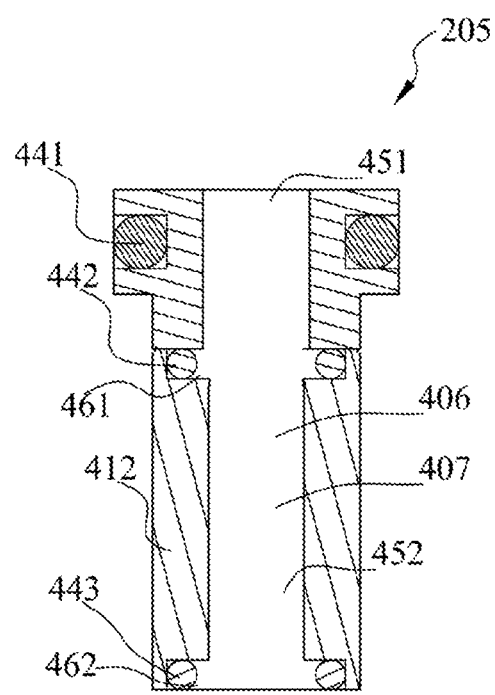
FIG. 4C is an axial cutaway view of the sleeve assembly shown in FIG. 4A.

FIG. 4A and FIG. 4B are respectively a 3-D view and an exploded view of the sleeve assembly 205, and FIG. 4C is an axial cutaway view of the sleeve assembly shown in FIG. 4A and is used to show the structure of the sleeve assembly 205. As shown in FIGS. 4A and 4B, the sleeve assembly 205 comprises a sleeve 401 and a plurality of seals. The sleeve 401 is roughly in the shape of a cylinder, a chamber 406 extending in the axial direction of the sleeve 401 and passing through the sleeve 401 is formed in the sleeve 401, and the chamber 406 forms a piston passage 407 and is used to accommodate the piston 103. In one embodiment of the present application, the sleeve 401 has an upper sleeve portion 411 and a lower sleeve portion 412. The upper sleeve portion 411 has an upper chamber 451, the lower sleeve portion 412 has a lower chamber 452, and the upper chamber 451 and the lower chamber 452 communicate with each other and jointly define the piston passage 407. The upper sleeve portion 411 comprises a head portion 421 and an end portion 422, wherein the end portion 422 extends downward from below the head portion 421. The outside diameter of the head portion 421 is roughly equal to the diameter of the upper section 381 of the chamber 305 of the casing, and the outside diameter of the end portion 422 is less than the outside diameter of the head portion 421. The outside diameter of the lower sleeve portion 412 is also less than the outside diameter of the head portion 421 of the upper sleeve portion 411.

An annular groove 429 circumferentially extending on the head portion 411 is arranged on the head portion 411, and the annular groove 429 is recessed inward from the surface of the outer side of the head portion 411. The annular groove 429 is used for mounting a head portion seal 441, and the head portion seal 441 is used for the sealing between the upper sleeve portion 411 and the casing 203. The diameter of the lower chamber 452 is larger at the upper end and lower end of the lower sleeve portion 412 to form seal accommodating portions 461 and 462, which are used to accommodate a lower sleeve portion first seal 442 and a lower sleeve portion second seal 443, respectively. The lower sleeve portion first seal 442 is used for sealing between the upper sleeve portion 411 and the lower sleeve portion 412, and the lower sleeve portion second seal 443 is used for sealing between the lower sleeve portion 412 and the nozzle 201. In the present embodiment, the head seal 441, the lower sleeve portion first seal 442 and the lower sleeve portion second seal 443 are all O-ring seals made of an elastic material, for example, rubber.

In another embodiment of the present application, the sleeve 401 is a one-piece structure, and in this case no seal is required between the upper sleeve portion and the lower sleeve portion.

Figure 5A:
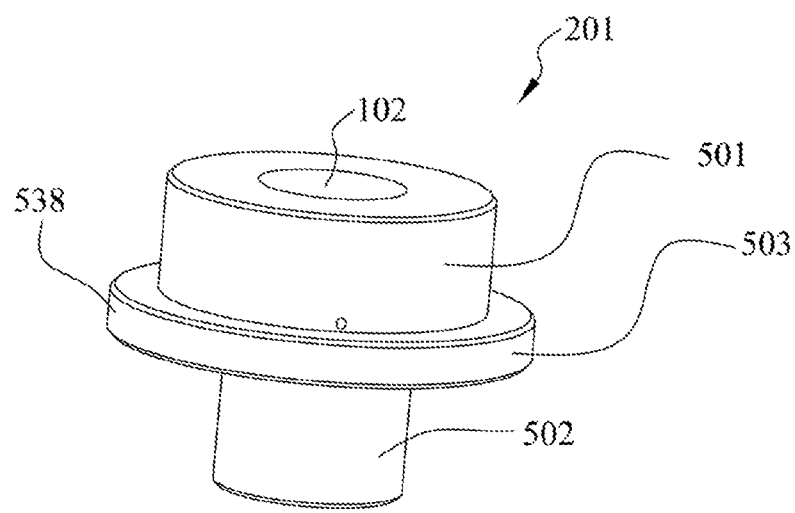
FIG. 5A is a 3-D view of the nozzle of the nozzle assembly shown in FIG. 1 in one direction.
Figure 5B:
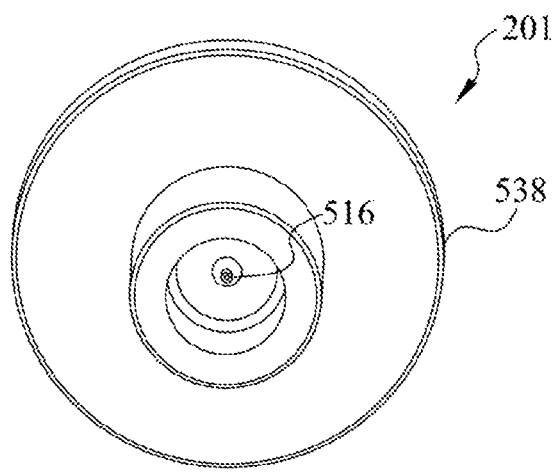
FIG. 5B is a 3-D view of the nozzle of the nozzle assembly shown in FIG. 5A in another direction.
Figure 5C:
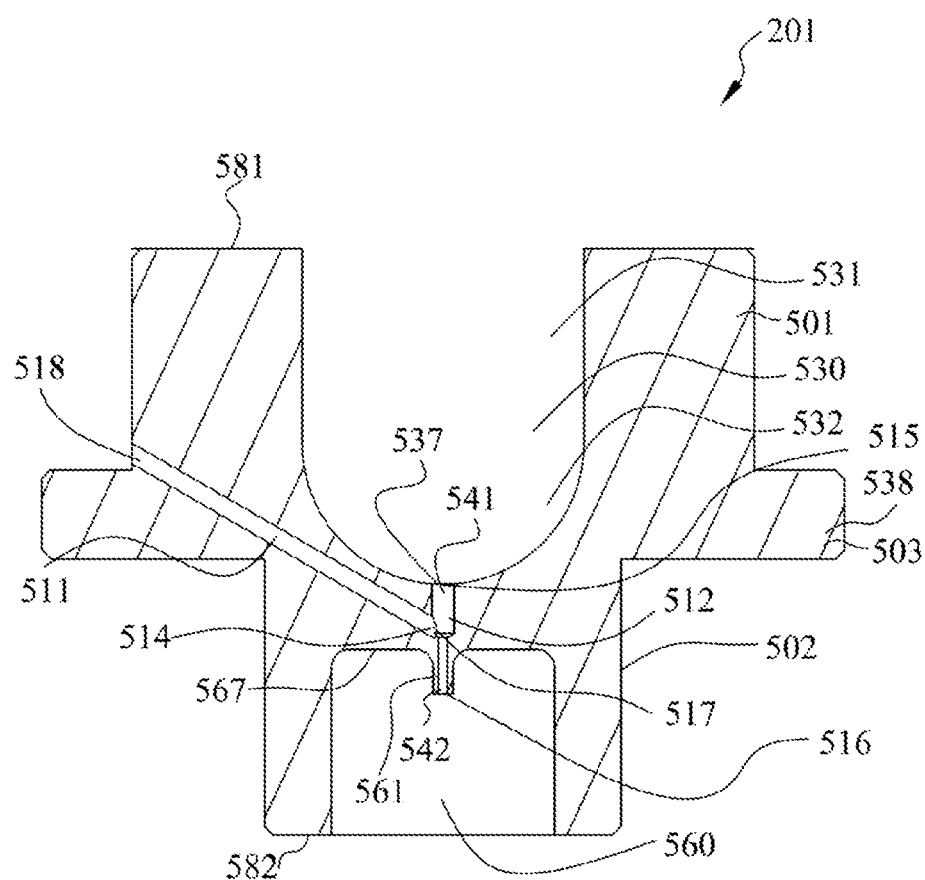
FIG. 5C is an axial cutaway view of the nozzle shown in FIG. 5A.

FIGS. 5A and 5B are respectively 3-D views of the nozzle 201 in two directions, and FIG. 5C is an axial cutaway view of the nozzle 201 in the direction of the fluid passage inlet 518 and is used to show the specific structure of the nozzle. As shown in FIGS. 5A, 5B and 5C, the nozzle 201 is roughly in the shape of a cylinder and has an upper nozzle section 501, a middle nozzle section 503 and a lower nozzle section 502. The outside diameter of the lower nozzle section 502 is less than the outside diameter of the middle nozzle section 503 so that the middle nozzle section 503 forms a flange 538 relative to the lower nozzle section 502. When the lower nozzle section 502 is inserted into the lower opening 318 of the casing from the top down, the flange 538 is stopped by the nozzle-limiting step 355 of the casing 203, and thus the nozzle 201 will not fall off the lower opening 318 of the casing 203. In addition, the diameter of the middle nozzle section 503 is greater than the diameter of the upper nozzle section 501 so that a certain distance exists between the upper nozzle section 501 and the inner side wall of the upper section 381 of the chamber 305 of the casing 203 when the nozzle 201 is mounted into the casing 203.

The nozzle 201 has a piston chamber 530, a nozzle passage 512 and a fluid passage 511, wherein the nozzle passage 512 communicates with the piston chamber 530 and the fluid passage 511 communicates with the nozzle passage 512. The piston chamber 530 is recessed inward from the upper surface 581 of the nozzle 201 and is used to accommodate the piston 103. The shape of the piston chamber 530 matches the shape of the piston 103 so that the piston 103 can touch closely against the inner wall of the piston chamber 530. The inner wall of the upper portion 531 of the piston chamber 530 is in the shape of a cylinder, the inner wall of the lower portion 532 is a smoothly-transitioned spherical surface extending downward from the inner wall of the upper portion 531, and an opening 537 is arranged on the lower portion 532. The nozzle passage 512 is located below the piston chamber 530 and has an airflow inlet 515, an airflow outlet 516 and a fluid inlet 517. Wherein, the fluid inlet 517 is arranged below the airflow inlet 515 and the airflow outlet 516 is arranged below the fluid inlet 517. The airflow inlet 515 communicates with or is aligned with the opening 537 of the piston chamber 530 so that the piston chamber 530 communicates with the nozzle passage 512. The fluid passage 511 has a fluid passage inlet 518 and a fluid passage outlet 514, the fluid passage inlet 518 communicates with a fluid source to lead the fluid into the fluid passage 511, and the fluid passage outlet 514 communicates with or is aligned with the fluid inlet 517 of the nozzle passage 512 so that the fluid can enter the nozzle passage 512 from the fluid passage 511. The nozzle passage 512 has an upper nozzle passage section 541 and a lower nozzle passage section 542, and the lower nozzle passage section 542 is thinner than the upper nozzle passage section 541. The airflow inlet 515 is arranged at the top of the upper nozzle passage section 541, and the airflow outlet 516 is arranged at the bottom of the lower nozzle passage section 542. The fluid inlet 517 communicates with the upper nozzle passage section 541 and the fluid inlet 517 is arranged near the joint between the upper nozzle passage section 541 and the lower nozzle passage section 542 on the side wall of the upper nozzle passage section 541. Air can be accelerated to press the fluid out of the nozzle passage 512 after flowing from the thicker upper nozzle passage section 541 into the thinner lower nozzle passage section 542.

The nozzle 201 further comprises a groove 560 recessed inward from the bottom surface 582 of the nozzle 201, a protruding portion 561 extends toward the bottom surface 582 of the nozzle 201 from the bottom 567 of the groove 560, the nozzle passage 512 passes through the protruding portion 561, and thus the airflow outlet 516 of the nozzle passage 512 is located at the lower end of the protruding portion 561. The airflow outlet 516 is located in the groove 560, that is to say, the position of the airflow outlet 516 is higher than the bottom surface 582 of the nozzle 201 in the horizontal direction shown in FIG. 5C.

In one embodiment of the present application, one fluid passage 511 exists, and in other embodiments, a plurality of fluid passages 511 may exist.

It should be noted that although the sleeve 401 and the nozzle 201 are separated components in the above-mentioned embodiments of the present application, the sleeve 401 and the nozzle 201 may be made into a one-piece component according to the present application in other embodiments.

Figure 6:
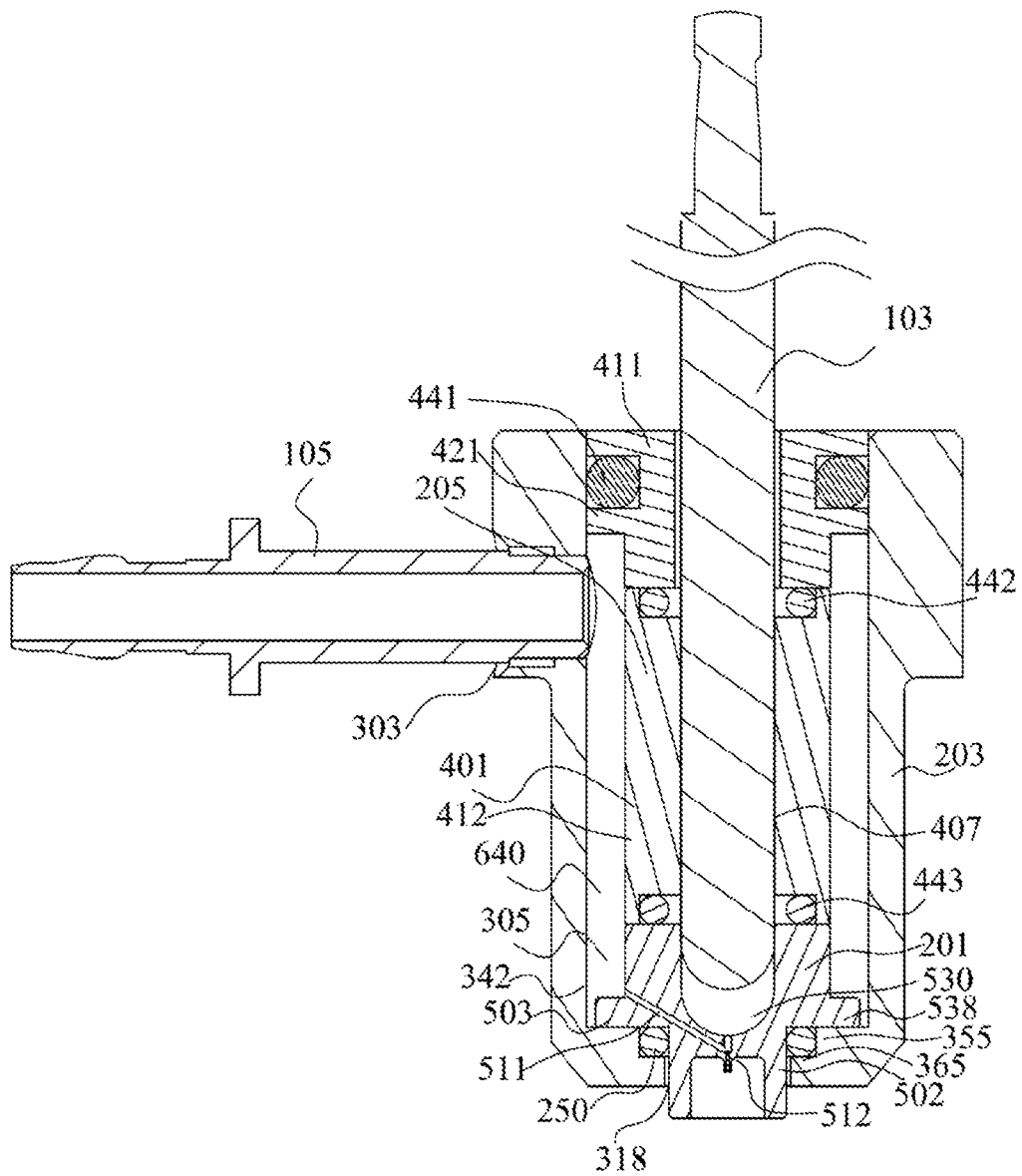
FIG. 6 is a cutaway view of the nozzle assembly shown in FIG. 1 in the A-A direction.

FIG. 6 is a cutaway view of the nozzle assembly 100 shown in FIG. 1 in the A-A direction and shows the connections between different components of the nozzle assembly. As shown in FIG. 6, the sleeve 401 and the nozzle 201 are mounted in the chamber 305 of the casing 203, and the sleeve 401 is mounted on the nozzle 201 so that the piston passage 407 can communicate with the piston chamber 530. The piston 103 is inserted into the piston passage 407 and the piston chamber 530 and can reciprocate in the piston passage 407 and the piston chamber 530. The shape of the head portion 135 of the piston 103 matches the shape of the piston chamber 530 so that the surfaces between them can fit each other and the piston 103 can draw in and discharge air through the nozzle passage 512 when reciprocating relative to the nozzle 201.

Since the outside diameter of the head portion 421 of the upper sleeve portion 411 is roughly equal to the diameter of the upper section 381 of the chamber 305 of the casing, the outer side of the head portion 421 of the upper sleeve portion 411 touches the inner wall of the casing 203. The lower nozzle section 502 passes through the opening 318 of the casing 203, and the middle nozzle section 503 is mounted on the nozzle-limiting step 355 in the casing 203. Thus, a fluid chamber 640 is formed between the outer sides of the nozzle 201 and the sleeve 401 and the inner side of the casing 203, and the fluid chamber 640 is used to accommodate the fluid which is led in from the outside of the casing 203. A fluid transport pipe 105 is mounted at the inlet 303 of the casing 203, one end of the fluid transport pipe 105 communicates with a fluid source, and the other end communicates with the fluid chamber 640 to lead the fluid into the fluid chamber 640. The fluid inlet 517 of the fluid passage 511 communicates with the fluid chamber 640 so that the fluid can enter the fluid passage 511 from the fluid chamber 640.

A head portion seal 441 is arranged at the joint between the sleeve 401 and the casing 203, the head portion seal 441 will be deformed if it receives a pressure between the inner wall 342 of the casing 203 and the outer side of the sleeve 401, and thus sealing is formed between the casing 203 and the sleeve 401 to prevent the fluid in the fluid chamber 640 from leaking out of the joint to the outside of the casing 203. A nozzle seal 250 is arranged at the joint between the nozzle 201 and the casing 203. After the nozzle 201 and the nozzle seal 250 are mounted into the casing 203, the nozzle seal 250 is confined between the flange 538 of the middle nozzle section 503 and the seal-limiting step 365 and will be deformed if it receives a squeeze between the lower portion of the middle nozzle section 503 and the seal-limiting step 365, and thus sealing is formed between the casing 203 and the nozzle 201 to prevent the fluid in the fluid chamber 640 from leaking out of the joint to the outside of the casing 203. A second seal 443 is arranged at the joint between the lower sleeve portion 412 and the nozzle 201, and the second seal 443 will be deformed to form sealing to prevent the fluid from entering the piston passage 407 and the piston chamber 530 if it receives a pressure between the lower sleeve portion 402 and the upper surface 581 of the nozzle 201. Thus, the fluid can enter the fluid chamber 640 only from the inlet 303 and flow out of the fluid passage 511 of the nozzle 201, but will not leak to the outside of the casing 203 or enter the piston passage 407 or the piston chamber 530.

In one embodiment of the present application, the seal 250 is put on the lower nozzle section 502 of the nozzle 201 and is close to the middle nozzle section 503, and thus the flange 538 of the seal 250 touches against the seal-limiting step 365 to form sealing. In another embodiment, the seal 250 is arranged below the flange 538 of the middle nozzle section 503 and touches the nozzle-limiting step 355 to form sealing. In a further embodiment, the seal 250 may be arranged on the outer side of the middle nozzle section 503, and thus the radial outer side of the seal 250 touches against the inner wall 342 of the casing to form sealing.

The following steps are involved when the nozzle assembly of the present application is used to distribute a fluid:

(1) The Fluid Enters the Nozzle Passage

Before the fluid is distributed, the piston 103 is in a position higher than the nozzle 201, namely, the initial position of the piston 103. At this time, the head portion of the piston 103 does not fully occupy the piston chamber 530 and the piston chamber 530 contains air. Since the viscosity of the fluid is usually very large, the fluid cannot spontaneously flow into the nozzle passage 512 from the fluid chamber 640, and a proper pressure can be applied at the fluid source to which the fluid transport pipe 105 is connected to press a proper amount of the fluid into the nozzle passage 512. The pressure applied varies with the properties of the fluid. In addition, in some special cases in which the fluid can enter the nozzle passage 512 by gravity, no pressure needs to be applied at the fluid source.

(2) Distribute the Fluid

When the nozzle assembly moves to the position to be processed, move the piston 103 down to squeeze the air in the piston chamber 530, and the squeezed air drives the fluid to flow out of the nozzle passage 512 and fall upon the position to be processed, thus completing one fluid distribution.

(3) Reset the Piston

After completing the fluid distribution, move the piston 103 up to return to the initial position to prepare it for the next fluid distribution. Since the viscosity of the fluid is large, the fluid cannot spontaneously flow into the nozzle passage 512 in the short moment after the fluid in the nozzle passage 512 is extruded by the air squeezed by the movement of the piston 103. At this time, the piston 103 moves up immediately and draws the ambient air into the nozzle chamber 530 through the nozzle passage 512 to complete the air suction process of the piston 103. The piston 103 returns to the initial position and gets ready for the next fluid distribution.

Since the piston 103 does not contact the fluid in the whole fluid distribution process, it is difficult for the fluid to adhere to the piston 103 and thus the flexibility of reciprocating motion of the piston 103 is not affected. The non-contact between the piston 103 and the fluid also lowers the possibility of the nozzle 201 being blocked by the viscous fluid. In addition, with the nozzle assembly of the present application adopted, the amount of the fluid to be distributed can be controlled by designing the thicknesses and lengths of the nozzle passage 512 and the fluid passage 511. Thus, the nozzle assembly of the present application is applicable to small-amount fluid distribution and can be applied to the chip-level electronic processing field.

Although only some characteristics of the present invention are illustrated and described in this document, those skilled in the art can make various improvements and changes. Therefore, it should be understood that the appended claims are intended to cover all improvements and changes falling within the spirit and scope of the present invention.

What is claimed is:

1. A nozzle, comprising:
a nozzle passage, the nozzle passage having an airflow inlet and an airflow outlet, and a fluid passage, the fluid passage having a fluid passage inlet and a fluid passage outlet,
wherein the fluid passage inlet communicates with a fluid source so that a fluid can enter the fluid passage, and the fluid passage outlet communicates with the nozzle passage so that the fluid can enter the nozzle passage,
wherein airflow exerted from the airflow inlet can press the fluid in the nozzle passage out of the airflow outlet,
wherein the nozzle further comprises a piston chamber, the piston chamber being used to accommodate a piston and the piston chamber communicating with the airflow inlet of the nozzle passage; and
wherein the piston chamber and the fluid passage are separately arranged.

2. The nozzle as claimed in claim 1, wherein:
the nozzle passage further has a fluid inlet, and
the fluid passage outlet communicates with the fluid inlet of the nozzle passage so that the fluid can enter the nozzle passage.

3. The nozzle as claimed in claim 1, wherein:
the fluid is a viscous fluid and the viscosity of the fluid ranges from 1000 cps to 150,000 cps.

4. The nozzle as claimed in claim 1, wherein:
a bottom of the piston chamber is in the shape of a smoothly-transitioned curved surface.

5. The nozzle as claimed in claim 1, wherein:
the airflow inlet is located below the piston chamber.

6. The nozzle as claimed in claim 1, wherein:
the fluid passage inlet is arranged on the side wall of the nozzle.

7. The nozzle as claimed in claim 1, wherein:
the fluid passage extends aslant downward from the fluid passage inlet to the fluid passage outlet.

8. The nozzle as claimed in claim 1, wherein:
the nozzle passage has an upper nozzle passage section and a lower nozzle passage section, and the lower nozzle passage section is thinner than the upper nozzle passage section, wherein the upper nozzle passage section communicates with the airflow inlet.

9. A nozzle assembly, comprising:
a casing, a chamber being arranged in the casing,
a sleeve, the sleeve being arranged in the chamber of the casing, the inner wall of the sleeve defining a piston passage, and a fluid chamber being arranged between the outer wall of the sleeve and the inner wall of the casing,
a nozzle, the nozzle being arranged in the chamber of the casing and being arranged below the sleeve, the nozzle comprising:
a nozzle passage, the nozzle passage having an airflow inlet and an airflow outlet,
a fluid passage, the fluid passage having a fluid passage inlet and a fluid passage outlet, wherein the fluid passage inlet communicates with the fluid chamber so that a fluid in the fluid chamber can enter the fluid passage, and the fluid passage outlet communicates with the nozzle passage so that the fluid can enter the nozzle passage,
a piston chamber, the piston chamber communicating with the airflow inlet of the nozzle passage and communicating with the piston passage, and
a piston, the piston being able to move up and down in the piston passage and the piston chamber and being able to draw in and discharge air through the nozzle passage to press the fluid in the nozzle passage out of the airflow outlet of the nozzle passage.

10. The nozzle assembly as claimed in claim 9, wherein the piston has a head portion, the shape of the head portion is configured to match the shape of the piston chamber of the nozzle so that the piston can draw in and discharge air through the nozzle passage when reciprocating relative to the nozzle.

11. The nozzle assembly as claimed in claim 9, wherein:
the casing has an inlet and the inlet communicates with the fluid chamber.

12. The nozzle assembly as claimed in claim 9, wherein:
the sleeve is seal-connected to the nozzle and the sleeve is seal-connected to the casing.

13. The nozzle assembly as claimed in claim 9, wherein:
the nozzle is seal-connected to the casing.

* * * * *